(12) United States Patent
Lim et al.

(10) Patent No.: US 8,519,385 B2
(45) Date of Patent: Aug. 27, 2013

(54) ORGANIC LIGHT EMITTING DIODE DISPLAY

(75) Inventors: Jae-Ik Lim, Yongin (KR); Yi-Joon Ahn, Yongin (KR); Gee-Bum Kim, Yongin (KR); Yong-Seok Yeo, Yongin (KR); Man-Seob Choi, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/465,768

(22) Filed: May 7, 2012

(65) Prior Publication Data

US 2013/0099258 A1  Apr. 25, 2013

(30) Foreign Application Priority Data

Oct. 24, 2011  (KR) .......................... 10-2011-0108853

(51) Int. Cl.
*H01L 29/08* (2006.01)
*H01L 35/24* (2006.01)
*H01L 51/00* (2006.01)

(52) U.S. Cl.
USPC ............ 257/40; 257/E33.074; 257/E51.005; 257/E51.006; 257/E51.018; 257/E51.019; 257/E51.02; 257/E51.026

(58) Field of Classification Search
USPC ............ 257/40, E33.074, E51.005, E51.006, 257/E51.018, E51.019, E51.02, E51.026
See application file for complete search history.

(56) References Cited

U.S. PATENT DOCUMENTS

| 5,585,951 | A  | * | 12/1996 | Noda et al. ..................... 349/122 |
| 7,480,019 | B2 | * | 1/2009  | Itami et al. ..................... 349/113 |
| 7,505,098 | B2 | * | 3/2009  | Nakamura et al. ............. 349/114 |
| 7,531,834 | B2 | * | 5/2009  | Lee et al. .......................... 257/40 |
| 7,902,087 | B2 | * | 3/2011  | Han et al. ....................... 438/784 |
| 2012/0001188 | A1 | * | 1/2012 | Hayashi ........................... 257/59 |
| 2012/0098421 | A1 | * | 4/2012 | Thompson ..................... 313/512 |

FOREIGN PATENT DOCUMENTS

| JP | 2007-188065 | 7/2007 |
| KR | 10-2010-0048608 | 5/2010 |

* cited by examiner

*Primary Examiner* — Ida M Soward
(74) *Attorney, Agent, or Firm* — Robert E. Bushnell, Esq.

(57) ABSTRACT

An organic light emitting diode (OLED) display according to an exemplary embodiment of the invention includes: a display substrate including a plurality of pixel areas; a tilt layer formed on the display substrate of each of the plurality of pixel areas, and having a tilt angle with respect to the display substrate; a first electrode formed on the tilt layer; an organic emission layer formed on the first electrode; a second electrode formed on the organic emission layer; an encapsulation substrate disposed on the second electrode and in parallel with the display substrate; and a prism sheet formed on the encapsulation substrate and having a plurality of prisms.

19 Claims, 3 Drawing Sheets

ORGANIC LIGHT EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office on the 24 Oct. 2011 and there duly assigned Serial No. 10-2011-0108853.

BACKGROUND OF THE INVENTION

1. Field of the Invention

The present invention relates generally to an organic light emitting diode (OLED) display. More particularly, the present invention relates to an OLED display in which a color shift problem is prevented.

2. Description of the Related Art

Unlike the liquid crystal display (LCD), an organic light emitting diode (OLED) display does not require a separate light source, thereby making it possible for it to be implemented as a slim and lightweight display. Furthermore, since the organic light emitting diode display has high quality characteristics such as lower power consumption, high luminance and short response time, it has been spotlighted as a next generation display device.

The OLED includes a plurality of light emitting diodes, each having a hole injection electrode, an organic emission layer, and an electron injection electrode. Electrons and holes are combined with each other in an organic emissive layer to thereby generate excitons. When the excitons shift from the excited state to the ground state, energy is generated so as to emit light, and images are displayed on the basis of the emitted light.

Meanwhile, the OLED display can improve efficiency of light emitted from the organic light emitting diode using a microcavity structure to prevent a decrease in efficiency due to total reflection between first and second electrodes of the organic light emitting diode. The microcavity structure can be maximized by controlling a distance between the first and second electrodes of the organic light emitting element.

However, when the OLED display has a microcavity structure, light efficiency may be increased but a color shift may occur.

The above information disclosed in this Background section is only for enhancement of an understanding of the background of the described technology, and therefore it may contain information that does not form the prior art that is already known in this country to a person of ordinary skill in the art.

SUMMARY OF THE INVENTION

The present invention has been developed in an effort to provide an OLED display having improved image quality by suppressing a color shift occurring due to a microcavity structure of an organic light emitting diode.

An organic light emitting diode (OLED) display according to an exemplary embodiment of the present invention includes: a display substrate including a plurality of pixel areas; a tilt layer formed on the display substrate of each of the plurality of pixel areas, and having a tilt angle with respect to the display substrate; a first electrode formed on the tilt layer; an organic emission layer formed on the first electrode; a second electrode formed on the organic emission layer; an encapsulation substrate disposed on the second electrode and in parallel with the display substrate; and a prism sheet formed on the encapsulation substrate and having a plurality of prisms.

The tilt layer may have a tilt angle in a range of 40 degrees to 80 degrees with respect to the display substrate.

An increase in the tilt angle of the tilt layer and an increase in a tilt angle of each prism of the prism sheet may have a constant correlation.

When the tilt angle of the tilt layer is 15 degrees, 19 degrees, 23 degrees, and 29 degrees, tilt angles of respectively corresponding prisms of the prism sheet are 45 degrees, 55 degrees, 65 degrees, and 75 degrees, respectively, according to the constant correlation, and a permissible error range of the tilt angle may be 2 degrees or less.

The OLED display may further include a pixel defining layer formed on the display substrate and having an opening partially or wholly exposing the first electrode, and the tilt layer may be disposed in the opening of the pixel defining layer.

The OLED display may further include a polarization member disposed between the second electrode and the prism sheet.

The polarization member may include a ¼ wavelength plate and a polarizing plate.

The polarization member may be formed on the encapsulation substrate, and the OLED display may further include a diffusion sheet disposed between the polarization member and the prism sheet.

Light emitted relatively close to a direction perpendicular to a tilt surface of the tilt layer among light emitted from the organic emission layer may be emitted to the outside through the prisms of the prism sheet. In addition, light emitted relatively close to a direction perpendicular to the encapsulation substrate among light emitted from the organic emission layer may be reflected by the prisms of the prism sheet and then disappear in the polarization member through internal reflection.

According to the exemplary embodiments, a color shift occurring due to a microcavity structure of the organic light emitting diode can be suppressed, and thus image quality can be improved.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
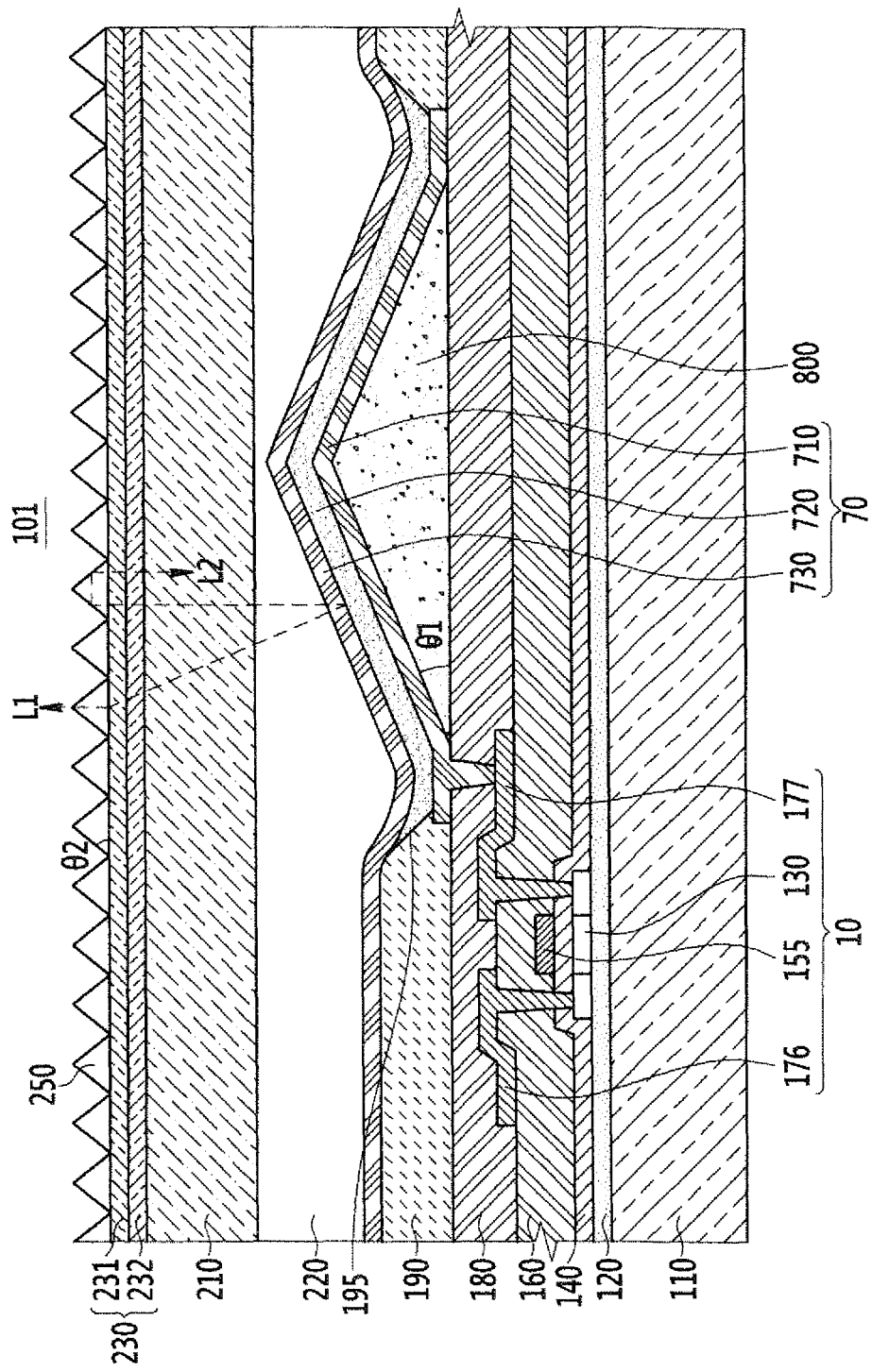
FIG. 1 is a cross-sectional view of an organic light emitting diode (OLED) display according to a first exemplary embodiment of the invention.

Hereinafter, exemplary embodiments will be described in detail with reference to the attached drawings so that the present invention can be easily put into practice by those skilled in the art. The present invention is not limited to the exemplary embodiments, but may be embodied in various forms.

Furthermore, in several exemplary embodiments, like reference numerals designate like elements having the same configuration, a first exemplary embodiment is representatively described, and in other embodiments, only a configuration that is different from that of the first exemplary embodiment is described.

The drawings are schematic and not proportionally scaled down. Relative scales and ratios in the drawings are enlarged or reduced for the purpose of accuracy and convenience, and the scales are random and not limited thereto. In addition, like reference numerals designate like structures, elements, or parts shown in two or more drawings. It will be understood that, when an element is referred to as being "on" another element, it can be directly on another element or intervening elements may be present therebetween.

Views of exemplary embodiment represent ideal exemplary embodiments in detail. Therefore, various modifications of diagrams are expected. Accordingly, exemplary embodiments are not limited to specific shapes of shown regions, and for example, also include modifications of the shape by manufacturing.

Hereinafter, an organic light emitting diode (OLED) display according to a first exemplary embodiment will be described with reference to FIG. 1.

FIG. 1 is a cross-sectional view of an organic light emitting diode (OLED) display according to a first exemplary embodiment of the invention.

As shown in FIG. 1, the OLED display 101 according to the first exemplary embodiment includes a display substrate 110, an organic light emitting element 70, a thin film transistor 10, a tilt layer 800, an encapsulation substrate 210, and a prism sheet 250.

The display substrate 110 includes a plurality of pixel areas. A pixel area is a unit area where a pixel that is a minimum unit for displaying an image is formed. The OLED display 101 displays image emitted from the organic light emitting element 70 formed in each pixel of the OLED display 101.

In addition, the display substrate 110 may be made of various materials known to a person skilled in the art, and the various materials include glass, quartz, and ceramic.

The thin film transistor 10 is formed on the display substrate 110. The thin film transistor 10 includes an active layer 130, a gate electrode 155, a source electrode 176, and a drain electrode 177. In FIG. 1, the thin film transistor 10 has a top gate structure in which the gate electrode 155 is formed on the active layer 130, but the first exemplary embodiment is not limited thereto. That is, the thin film transistor may have various structures known to a person skilled in the art.

Furthermore, in FIG. 1, the active layer 130 is a polysilicon layer formed by crystallizing an amorphous silicon layer using a laser. A crystallization method using a laser may include various crystallization methods known to a person skilled in the art, and the various crystallization methods include an excimer laser annealing (ELA) method, and the like. In addition, the active layer 130 may be formed of amorphous silicon or an oxide semiconductor.

The gate electrode 155 is disposed on one area of the active layer 130, and a gate insulation layer 140 is disposed between the gate electrode 155 and the active layer 130. The gate electrode 155 may be formed of various conductive materials known to a person skilled in the art. The gate insulation layer 140 may be formed of at least one of tetra ethyl ortho silicate (TEOS), silicon nitride ($SiN_x$), and silicon oxide ($SiO_2$). For example, the gate insulation layer 140 may have a double-layered structure in which a silicon nitride layer having a thickness of 40 nm and a TEOS layer having a thickness of 80 nm are sequentially layered. However, the structure of the gate insulation layer 140 is not limited to the above-described structure in the first exemplary embodiment.

The source electrode 176 and the drain electrode 177 respectively contact the active layer 130. The source electrode 176 and the drain electrode 177 may also be formed of various conductive materials known to a person skilled in the art. The source electrode 176 and the drain electrode 177 are separated from each other, and are insulated from the gate electrode 155 by an interlayer insulation layer 160 which may be disposed between the source electrode 176 and the drain electrode 177. The interlayer insulation layer 160 may be formed of various insulation materials known to a person skilled in the art.

In addition, the OLED display 101 may further include a barrier layer 120 disposed between the thin film transistor 10 and the display substrate 110. In further detail, the barrier layer 120 may be disposed between the active layer 130 and the display substrate 110. For example, the barrier layer 120 may have a single layer of silicon nitride ($SiN_x$) or a double-layered structure in which silicon nitride ($SiN_x$) and silicon oxide ($SiO_2$) are layered. The barrier layer 120 has a role of preventing unneeded components like impure elements or moisture from intruding into the target, while flattening the surface thereof. However, the barrier layer 120 may be omitted depending upon the kind and processing conditions of the display substrate 110.

The OLED display 101 may further include an upper insulation layer 180 disposed between the source electrode 176 and the organic light emitting element 70. The upper insulation layer 180 may have a planarization characteristic The tilt layer 800 is formed on the display substrate 110 for each of the plurality of pixel areas. In further detail, the tilt layer 800 is formed on the upper insulation layer 180. However, the first exemplary embodiment is not limited thereto, and the tilt layer 800 may be integrally formed with the upper insulation layer 180. In this case, the upper insulation layer 180 and the tilt layer 800 may be formed through an exposure process using a half-tone mask.

The tilt layer 800 has a tilt angle θ1 with respect to the upper insulation layer 180 and the display substrate 110. The tilt layer 800 has a triangle-shaped cross-section, and may be formed in various shapes, such as triangular pyramid, quadrangular pyramid, prism, and the like.

In addition, in the first exemplary embodiment, the tilt layer 800 has a tilt angle θ1 in a range of 40 degrees to 80 degrees with respect to the display substrate 110.

The tilt layer 800 may be formed of various organic or inorganic materials known to a person skilled in the art. For example, the tilt layer 800 may be formed of a polymer-based material. In this regard, the polymer-based material includes acryl-based resin, epoxy-based resin, polyimide-based resin, polyethylene, and the like.

In the first exemplary embodiment, the organic light emitting element 70 is formed on a tilt surface of the tilt layer 800. The organic light emitting element 70 includes a first electrode 710 formed on the tilt layer 800 and connected to the drain electrode 177 of the thin film transistor 10, an organic emission layer 720 formed on the first electrode 710, and a second electrode 730 formed on the organic emission layer 720. In FIG. 1, the first electrode 710 becomes an anode and the second electrode 730 becomes a cathode. However, the first exemplary embodiment is not limited thereto, and the first electrode 710 may be a cathode and the second electrode 730 may be an anode according to the driving method.

The organic light emitting element 70 according to the first exemplary embodiment has a microcavity structure. The microcavity structure can improve light efficiency of the OLED display 101 by preventing decrease in light efficiency due to total reflection between the first electrode 710 and the second electrode 730. The microcavity structure can maximize light efficiency by controlling a distance between the first electrode 710 and the second electrode 730 of the organic light emitting element 70, and may have various structures known to a person skilled in the art.

Furthermore, the OLED display 101 may further include a pixel defining layer 190 formed on the display substrate 110 and having an opening 195 partially or entirely exposing the first electrode 710 of each pixel area. In this case, the tilt layer 800 is disposed in the opening 195 of the pixel defining layer 190. In addition, the organic light emitting element 70 is formed in the opening 195 of the pixel defining layer 190. That is, the opening 195 of the pixel defining layer 190 defines a light emission area.

The encapsulation substrate 210 protects the organic light emitting element 70 by covering the same. The encapsulation substrate 210 is sealed with the display substrate 110 to prevent permeation of moisture or oxygen into the organic light emitting element 70.

The encapsulation substrate 210 may be formed of a glass-based material. However, the first exemplary embodiment is not limited thereto, and the encapsulation substrate 210 may be formed of various materials known to a person skilled in the art.

A prism sheet 250 is formed on the encapsulation substrate 210. The prism sheet 250 includes a plurality of prisms. In addition, a tilt angle θ2 of the prism of the prism sheet 250 and the tilt angle θ1 of the tilt layer 800 have a constant correlation.

Figure 2:
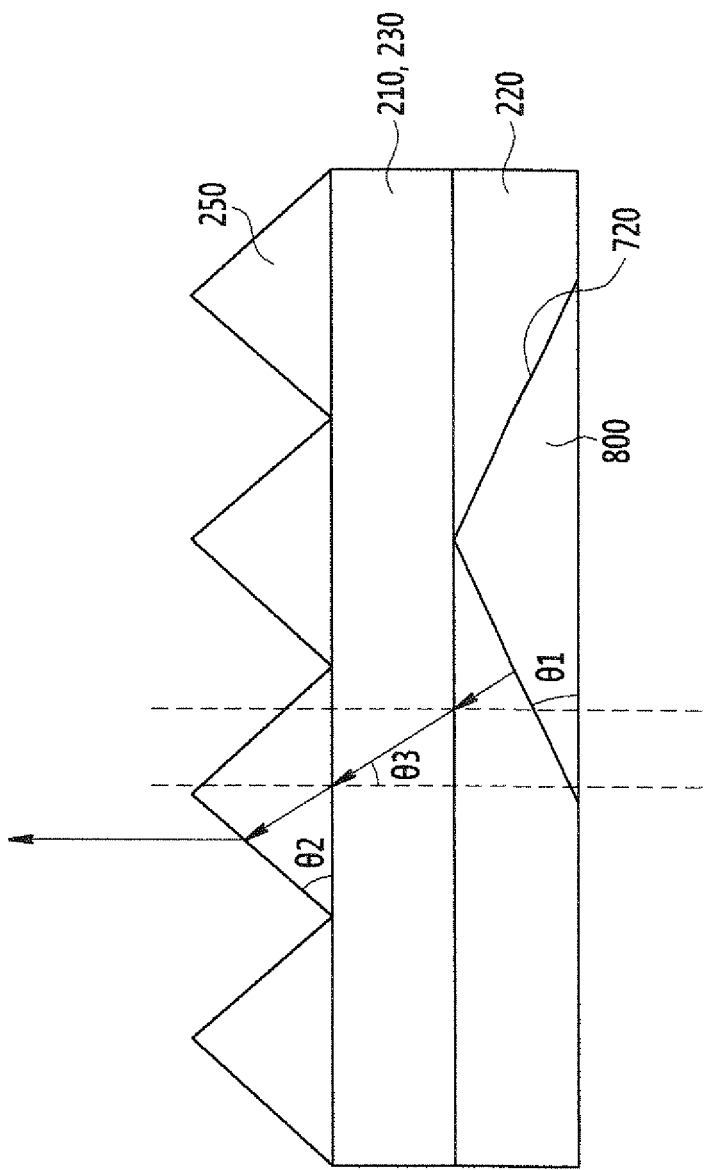
FIG. 2 shows a light path of the OLED display of FIG. 1.

FIG. 2 shows a light path of the OLED display of FIG. 1.

Referring to FIG. 2, in the first exemplary embodiment, when tilt angle θ1 of the tilt layer 800 is 15 degrees, 19 degrees, 23 degrees, and 29 degrees, the tilt angles θ2 of the respectively corresponding prisms are set to 45 degrees, 55 degrees, 65 degrees, and 75 degrees, respectively. In this case, a permissible error range of the tilt angles θ1 and θ2 is 2 degrees or less.

Meanwhile, light passing through the above-stated process among light generated from the organic light emitting element 70 is emitted to the outside of the encapsulation substrate 210 with an angle θ3 of 43 degrees. Light having a light emission angle θ3 which exceeds 43 degrees cannot be emitted to the outside of the encapsulation substrate 210, and is thus reflected to the interior of the encapsulation substrate 210.

Referring back to FIG. 1, the OLED display 101 according to the first exemplary embodiment further includes a polarization member 230 disposed between the encapsulation substrate 210 and the prism sheet 250. In this case, the polarization member 230 may be disposed between the prism sheet 250 and the second electrode 730 of the organic light emitting element 70.

Further referring to FIG. 1, the polarization member 230 absorbs light entering from the outside through the encapsulation substrate 210 so as to suppress reflection of external light. The polarization member 230 includes a polarizing plate 231 and a ¼ wavelength plate 232, and external light absorption theory of the polarization member 230 is a known method.

In addition, the OLED display 101 according to the first exemplary embodiment further includes a capping layer (CPL) 220 disposed between the encapsulation substrate 210 and the organic light emitting element 70. The capping layer 220 protects the organic light emitting element 70, and reduces a reflective index difference with an air layer by filling a space between the organic light emitting element 70 and the encapsulation substrate 210.

With such a configuration, the OLED display 101 according to the first exemplary embodiment can improve image quality by suppressing a color shift occurring due to the microcavity structure of the organic light emitting element 70.

In the OLED display 101 according to the first exemplary embodiment, light L1 emitted relatively close to a direction perpendicular to a tilt surface of the tilt layer 800 among light emitted from the organic emission layer 720 is emitted to the outside through the prisms of the prism sheet 250, and light L2 emitted relatively close to a direction perpendicular to the encapsulation substrate 210 among light emitted from the organic emission layer 70 is reflected by the prisms of the prism sheet 250, and then disappears in the polarization member 230 through internal reflection.

Hereinafter, an OLED display 102 according to a second exemplary embodiment will be described with reference to FIG. 3.

Figure 3:
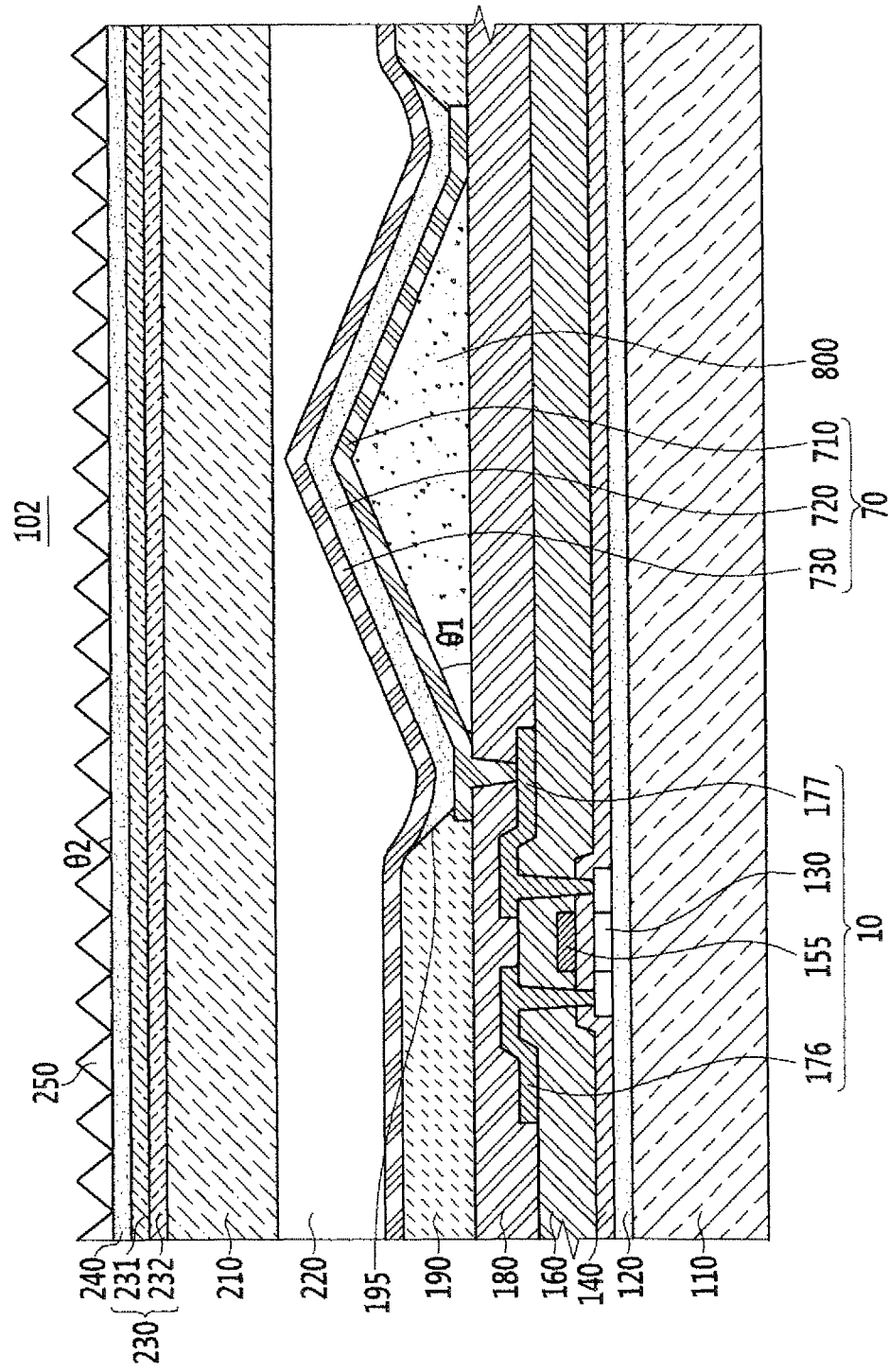
FIG. 3 is a cross-sectional view of an OLED display according to a second exemplary embodiment of the invention.

FIG. 3 is a cross-sectional view of an OLED display according to a second exemplary embodiment of the invention.

As shown in FIG. 3, the OLED display 102 according to the second exemplary embodiment further includes a diffusion sheet 240 disposed between a polarization member 230 and a prism sheet 250.

The prism sheet 250 diffuses light having reinforced straightness while passing through the prism sheet 250, thereby improving image quality of the OLED display 102.

With such a configuration, the OLED display 102 according to the second exemplary embodiment can improve image quality by further effectively suppressing a color shift occurring due to a microcavity structure of the organic light emitting element 70.

While the invention has been described in connection with what is presently considered to be practical exemplary embodiments, it is to be understood that the invention is not limited to the disclosed embodiments but, on the contrary, is intended to cover various modifications and equivalent arrangements included within the spirit and scope of the appended claims.

What is claimed is:

1. An organic light emitting diode (OLED) display, comprising:
   a display substrate including a plurality of pixel areas;
   a tilt layer formed on the display substrate of each of the plurality of pixel areas, and having a tilt angle with respect to the display substrate;
   a first electrode formed on the tilt layer;
   an organic emission layer formed on the first electrode;
   a second electrode formed on the organic emission layer;
   an encapsulation substrate disposed on the second electrode and in parallel with the display substrate; and
   a prism sheet formed on the encapsulation substrate and having a plurality of prisms.

2. The OLED display of claim 1, wherein the tilt layer has a tilt angle in a range of 40 degrees to 80 degrees with respect to the display substrate.

3. The OLED display of claim 2, wherein an increase in the tilt angle of the tilt layer and an increase in a tilt angle of each prism of the prism sheet have a constant correlation.

4. The OLED display of claim 3, wherein, when the tilt angle of the tilt layer is 15 degrees, 19 degrees, 23 degrees, and 29 degrees, tilt angles of corresponding prisms of the prism sheet are 45 degrees, 55 degrees, 65 degrees, and 75 degrees, respectively, according to the constant correlation, and a permissible error range of the tilt angle is not greater than 2 degrees.

5. The OLED display of claim 1, further comprising a pixel defining layer formed on the display substrate and having an opening at least partially exposing the first electrode;
wherein the tilt layer is disposed in the opening of the pixel defining layer.

6. The OLED display of claim 1, further comprising a polarization member disposed between the second electrode and the prism sheet.

7. The OLED display of claim 6, wherein the polarization member comprises a ¼ wavelength plate and a polarizing plate.

8. The OLED display of claim 6, wherein the polarization member is formed on the encapsulation substrate, and the OLED display further comprises a diffusion sheet disposed between the polarization member and the prism sheet.

9. The OLED display of claim 6, wherein light emitted relatively close to a direction perpendicular to a tilt surface of the tilt layer among light emitted from the organic emission layer is emitted to an outside through the prisms of the prism sheet, and light emitted relatively close to a direction perpendicular to the encapsulation substrate among light emitted from the organic emission layer is reflected by the prisms of the prism sheet and then disappears in the polarization member through internal reflection.

10. The OLED display of claim 1, further comprising a capping layer disposed between the second electrode and the encapsulation substrate.

11. The OLED display of claim 1, further comprising a thin film transistor (TFT) disposed on the display substrate.

12. The OLED display of claim 11, further comprising a barrier layer disposed between the display substrate and the TFT.

13. The OLED display of claim 12, further comprising an upper insulation layer disposed between the TFT, on one side, and the tilt layer, the first electrode, the organic emission layer and the second electrode, on another side.

14. The OLED display of claim 13, further comprising a pixel defining layer disposed between the upper insulation layer and the second electrode.

15. The OLED display of claim 11, wherein the TFT comprises an active layer, a gate insulation layer disposed on the active layer, and a gate electrode disposed on the gate insulation layer.

16. The OLED display of claim 15, further comprising an interlayer insulation layer disposed on the gate insulation layer and the gate electrode.

17. The OLED display of claim 16, further comprising an upper insulation layer disposed on the interlayer insulation layer.

18. The OLED display of claim 16, wherein the TFT further comprises a source electrode and a drain electrode, each of which extends through the interlayer insulation layer and the gate insulation layer so as to be connected to the active layer.

19. The OLED display of claim 18, further comprising an upper insulation layer disposed on the interlayer insulation layer, wherein the first electrode extends through the upper insulation layer so as to be connected to the drain electrode.

* * * * *